(12) United States Patent
Jordan

(10) Patent No.: US 6,252,771 B1
(45) Date of Patent: Jun. 26, 2001

(54) REMOVABLE REMOTE CONTROL AMPLIFIER

(75) Inventor: Jeff B. Jordan, Baton Rouge, LA (US)

(73) Assignee: Southern Audio Services, Baton Rouge, LA (US)

( * ) Notice: Subject to any disclaimer, the term of this patent is extended or adjusted under 35 U.S.C. 154(b) by 0 days.

(21) Appl. No.: 09/226,373

(22) Filed: Jan. 6, 1999

(51) Int. Cl.[7] .................................................. H05K 7/20
(52) U.S. Cl. .......................... 361/704; 361/688; 361/689; 361/698; 361/699; 361/707; 361/720; 257/714; 174/15.1; 165/80.4; 330/66; 330/207 P
(58) Field of Search ..................... 361/686–690, 361/699–704, 707, 709, 710, 713, 719, 720; 257/714–719; 174/15.1, 15.2, 16.3; 165/80.4; 330/66, 207 P

(56) References Cited

U.S. PATENT DOCUMENTS

| | | |
|---|---|---|
| 3,481,393 * | 12/1969 | Chu ...................................... 165/80.4 |
| 3,651,865 | 3/1972 | Feldmanis ............................... 165/80 |
| 4,120,019 * | 10/1978 | Arii et al. .............................. 361/699 |
| 4,860,164 | 8/1989 | Kaufman ................................. 361/388 |
| 4,963,833 | 10/1990 | Mountz .................................... 330/65 |
| 5,001,601 * | 3/1991 | Fuoco .................................... 361/699 |
| 5,162,974 | 11/1992 | Currie .................................... 361/385 |
| 5,508,908 * | 4/1996 | Kazama et al. ....................... 361/700 |
| 5,636,684 * | 6/1997 | Teytu et al. ........................... 165/80.4 |
| 5,646,773 | 7/1997 | Injeyan et al. ....................... 359/337 |
| 5,703,536 | 12/1997 | Davis et al. ........................... 330/289 |
| 5,901,037 * | 5/1999 | Hamilton et al. ..................... 361/699 |

* cited by examiner

Primary Examiner—Leo P. Picard
Assistant Examiner—Boris L. Chervinsky
(74) Attorney, Agent, or Firm—Roy, Kiesel & Tucker

(57) ABSTRACT

An amplifier having removable remote controls and the ability to easily couple with other amplifiers for easy mounting is disclosed. The amplifier includes removable remote controls and isocoupling systems that connect two or more amplifiers and that electrically insulate the mounting screws from the mounting surface. The amplifier may also be liquid cooled to dissipate heat generated by the amplifier.

29 Claims, 3 Drawing Sheets

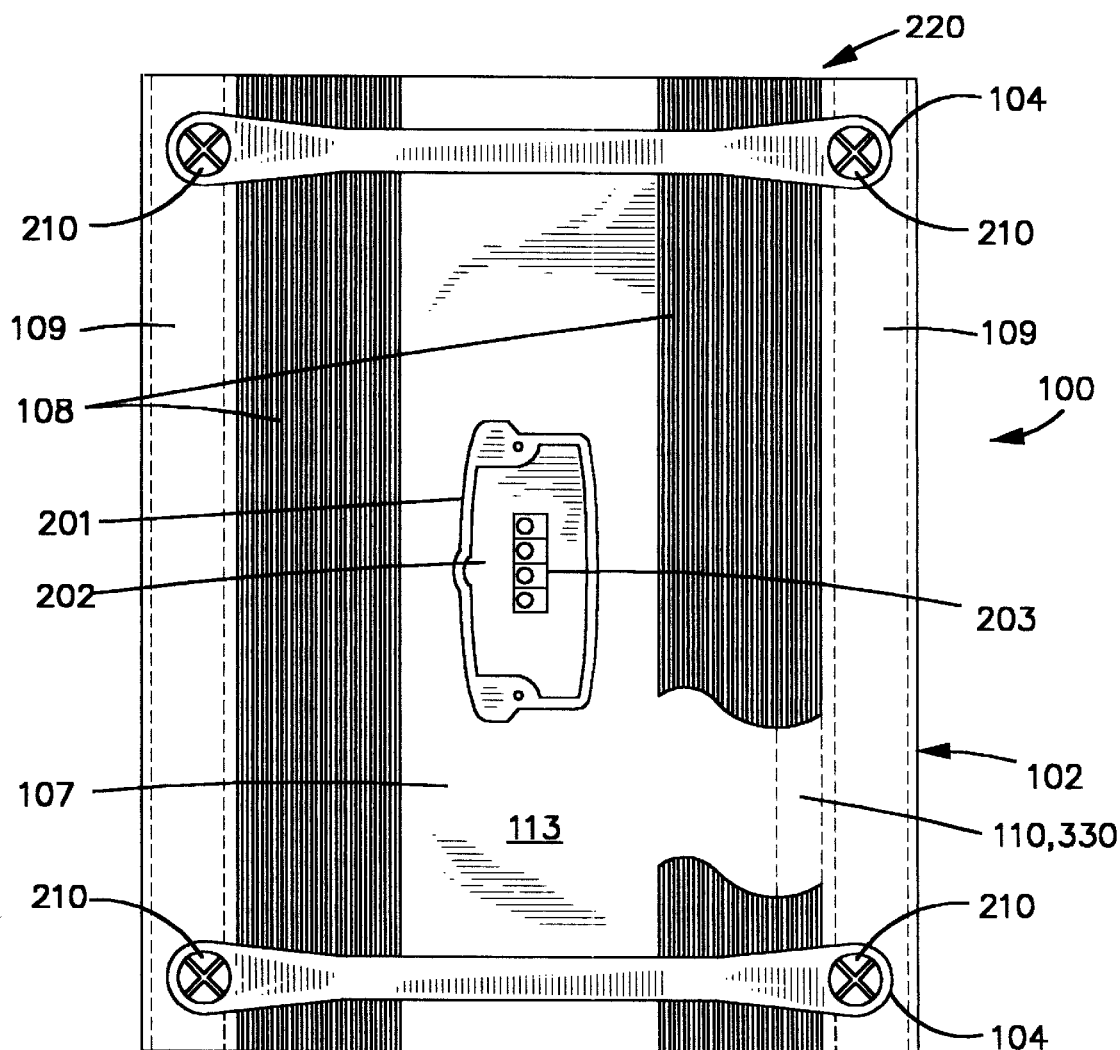
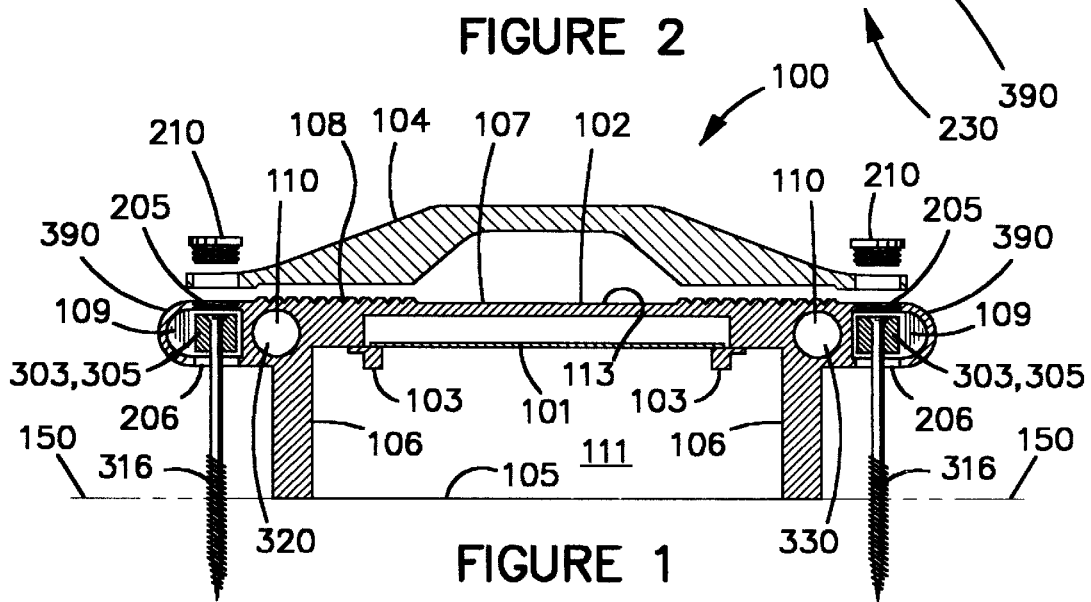
FIGURE 2
FIGURE 1

REMOVABLE REMOTE CONTROL AMPLIFIER

BACKGROUND OF THE INVENTION

1. Field of the Invention

This invention relates to amplifiers, more particularly to amplifiers with removable remote controls and isocoupling systems that connect two or more amplifiers and that electrically insulate the heat sink from the mounting surface by isolating the mounting screws. The amplifier may also be liquid-cooled to dissipate heat generated by the amplifier.

2. Prior Art

Amplifiers are used in the audio industry to amplify and control the energy that passes to speakers for ultimate sound output. Amplifiers have one or more controls or potentiometers that are used to tune and adjust gain (power output level), crossover frequencies, and equalization settings. Many amplifiers position these controls along a sidewall of the amplifier such that when it is mounted flush to a wall or under a seat, access to the controls is limited. Additionally, when a plurality of amplifiers is mounted in unison or very close to one another, access to the controls is further limited. In both cases, visual access to the controls is equally limited because the identifying writing associated with each particular control is often hidden from view. Some amplifiers are constructed with jacks therein so that a control pod can be placed remotely from the amplifier. This arrangement has created problems because not all controls have been placed on the remote control pod. Further, there are two sets of controls that may conflict with each other, and the amplifier may not perform optimally because both sets of controls can often be adjusted independently. Noise can be introduced into the system through the amplifier because of the duplicity of controls and added user installation complexity. Another obvious disadvantage is that the user is required to purchase an additional set(s) of controls which adds unnecessary expense to the final system.

It is well known that during the course of operation, amplifiers generate large quantities of heat. A variety of methods are presently used to dissipate heat, including cooling fins and heat sinks, passing air over the cooling fins, and even contacting separate cooling tubing with the cooling fins. Unfortunately, these methods can be expensive and very inefficient. If the cooling tubes burst or leak, the internal circuit boards of the amplifier may be damaged by the circulating coolant. Therefore, a need exists for an amplifier that can avoid these problems.

OBJECTS AND ADVANTAGES OF THE INVENTION

With the aforementioned considerations in mind, it is therefore an object of this invention to provide an amplifier that can dissipate heat without endangering the internal circuitry from coolant leaks.

It is a further object of this invention to provide a liquid-cooled amplifier that can be remotely adjusted and controlled.

It is a further object of this invention to provide an amplifier that allows easy access to and visibility of the controls.

It is a further object of this invention to provide an amplifier having a heat sink that is electrically isolated from the surface to which the amplifier is mounted.

It is a further object of this invention to provide an amplifier that can be physically linked to other similar amplifiers.

The present invention has several distinct advantages over the prior art. First, the use of removable remote controls allows the user to adjust and tune the amplifier without having to access the amplifier. Second, the use of the isocoupling system has two distinct advantages. The isocouplings electrically isolate the mounting screws from the heat sink and allow two or more amplifiers to be coupled. Finally, by using an extrudable material to construct the amplifier heat sink, the costs of manufacturing the invention are decreased. The cooling channels constructed within the heat sink are in thermal communication with the heat generating devices on the amplifier circuit board, but are offset from internal circuit boards. Thus, there is less likelihood that a coolant leak from the cooling channel will damage the internal circuit boards. The heat sink is constructed to have one or more isocoupling bores therein so that two or more amplifiers can be mounted together and a single coolant circuit can be created for a plurality of amplifiers. The coolant circuit is operatively connectable to a source of coolant.

These and other advantages and objects of this invention shall become apparent from the ensuing description of the invention.

SUMMARY OF THE INVENTION

To achieve one or more of the above-stated objects, the invention herein comprises a circuit board having one or more controls operatively connected thereto and a control pod removably attached to the circuit board and remotely positionable relative to the amplifier. The control pod maintains communication with the circuit board when the control pod is remotely positioned. The control pod houses one or more amplifier controls. The amplifier may further comprise an isocoupling configured to electrically isolate the amplifier from a surface onto which the amplifier is mounted and to allow two or more amplifiers to be coupled to one another. The amplifier may further comprise a heat sink configured to have one or more isocoupling bores configured therein with the isocoupling bores having one or more apertures therein. The invention may also comprise at least one heat generating device and a heat sink in thermal communication with the heat generating device. The heat sink is configured to have at least one cooling channel extending therethrough, which is attachable to a source of coolant so that when the amplifier is operated, the generated heat is dissipated.

Alternatively, the invention may comprise an amplifier having a circuit board having one or more controls operatively connected thereto and a heat sink in thermal communication with the circuit board and having one or more isocoupling bores configured therein, which have one or more apertures therein. The invention can further comprise a control pod removably attached to the circuit board and remotely positionable relative to the amplifier. The control pod maintains communication with the circuit board when remotely positioned from the amplifier and houses at least one of the controls. The invention may further comprise an isocoupling configured to electrically isolate the amplifier from a surface onto which the amplifier is mounted. The amplifier may have a heat generating device in thermal communication with the circuit board and the heat sink. The heat sink is then configured to have at least one cooling channel extending therethrough and attachable to a source of coolant.

BRIEF DESCRIPTION OF THE DRAWINGS

FIG. 1 is a side view of the invention including an illustration of a cross-sectional view of the isocoupling when the amplifier is mounted.

FIG. 2 is a top view of the invention with the control pod access panel removed.

DETAILED DESCRIPTION OF PREFERRED EMBODIMENTS OF THE INVENTION

Illustrations of preferred construction, design, and methods of operation of the invention are set forth below with specific references to the Figures. However, it is not the intent of the inventor that the scope of his invention be limited to these preferred embodiments.

Figure 3:
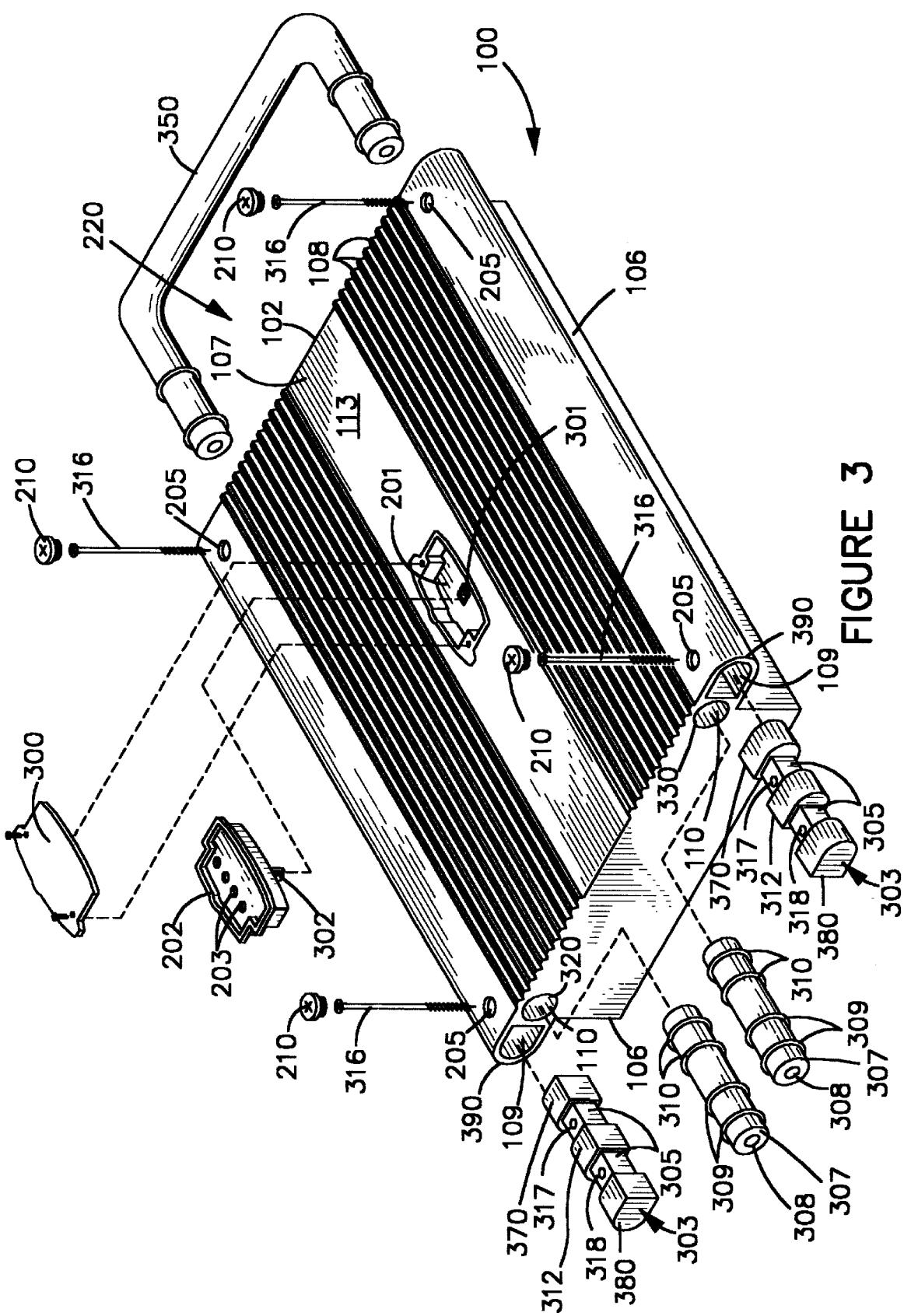
FIG. 3 is a perspective view of the invention with the amplifier control pod, isocoupling and channel coupling exploded.

As shown in FIG. 1, the preferred embodiment of the invention comprises an amplifier 100 having an internal circuit board 101, which includes one or more output devices 103 that generate heat. Output devices 103 can include, but are not limited to mosfet, Bridge Tied Load (BTL), and Darlington output devices. Output devices 103 attach to circuit board 101 and are in thermal communication with an amplifier heat sink 102, which houses circuit board 101. Heat sink 102 includes side walls 106 and an upper wall 107 which are configured to define an interior 111 that houses the circuit board 101. Heat sink may also include a bottom 105. One or more handles 104 may attach to amplifier 100 along upper wall 107, or elsewhere, to ease in handling. Handles 104 attach to heat sink 102 using screws 210 or other suitable connecting members as shown in FIGS. 2 and 3. One or more cooling fins 108 are positioned along the outer surface 113 of upper wall 107 to aid in the dissipation of heat generated by the output devices 103, but cooling fins 108 may be positioned elsewhere on heat sink 102. Though not shown, amplifier could be mounted on legs so that amplifier 100 is raised from mounting surface 150.

As seen in FIGS. 1–4, heat sink 102 is configured to have one or more coolant channels 110 extending therethrough between ends 220, 230. Coolant channels 110 may be constructed in upper wall 107 or sidewalls 106, preferably positioned offset from amplifier control pod 202 and circuit board 101 as described below. Heat sink 102 is also configured to have one or more isocoupling bores 109 therein to allow two or more amplifiers to be mounted together as discussed below. Bores 109 extend into heat sink 102 to allow isocouplings 303 to be positioned therein. Preferably, bores 109 extend completely through heat sink 102 between ends 220, 230 and preferably configured so that isocoupling 303 will couple two amplifiers as described below.

As shown in FIG. 2, heat sink 102 is configured to have a receptacle 201 positioned within upper wall 107 along upper surface 113, or elsewhere, to allow access to the amplifier control pod 202. Receptacle 201 allows amplifier control pod 202 to be securely and removably attached to circuit board 101 beneath access panel 300. Amplifier control pod 202 is removably attached so that amplifier 100 can be remotely operated without the necessity or problems associated with duplicate controls 203. Removable control pod 202 also acts as an anti-theft device because amplifier 100 cannot be properly tuned without control pod 202.

Amplifier 100 has one or more controls 203 which operatively connect to circuit board 101 to adjust and tune gain crossover frequencies, equalization settings and any other settings. Control pod 202 may house all of the amplifier controls 203. Alternatively, control pod 202 may house only pre-selected controls 203 while the remainder of the controls remain operatively connected to circuit board 101 and positioned for easy access by a user. Although not necessary in either embodiment, it is preferred that any controls 203 positioned on control pod 202 not be located elsewhere on amplifier 100 to avoid duplicity of controls.

Referring to FIG. 3, amplifier 100 is configured so that the amplifier control pod 202 has a male jack 302 that mates with a female jack 301 positioned within receptacle 201 that allows amplifier control pod 202 to be removable and allows for remote fine tuning of amplifier 100. Female jack 301 is operatively connected to circuit board 101 to allow control pod 202 to electronically communicate with circuit board 101. When amplifier control pod 202 is mounted within amplifier 100, malejack 302 engages female jack 301. Access panel 300 is positioned over receptacle 201 when amplifier control pod 202 is mounted within amplifier 100.

Amplifier control pod 202 is configured so that it may be removed and located remotely from amplifier 100. When amplifier control pod 202 is remotely positioned, a cable, not shown, may extend between male jack 302 and female jack 301 or an additional jack (not shown) positioned elsewhere on amplifier 100 and operatively connected to circuit board 101. Alternatively, wireless-signaling devices, such as radio frequency and infrared transmitters and receivers may be used to transmit the necessary electronic signals between amplifier control pod 202 and circuit board 101. Accordingly, amplifier control pod 202 may have a wireless transmitter positioned thereon, and circuit board 101 may have a wireless receiver positioned thereon. In either embodiment, control pod 202 maintains communication with circuit board 101 when amplifier 100 is operated.

Referring back to FIGS. 1 and 2, heat sink 102 is configured with one or more isocoupling bores 109 therein which preferably extend between ends 220, 230. Isocoupling bores 109 are configured to have corresponding apertures, upper aperture 205 and lower aperture 206 at each end 220, 230, more preferably near each corner of amplifier 100. Apertures 205, 206 are aligned with one another and configured so that mounting screw 316 can pass through them to allow amplifier 100 to securely mount onto surface 150 by passing mounting screw 316 through isocoupling 303 and into mounting surface 150 as described below. Aperture 205 is threaded to receive screw 210 so that handles 104 can mount onto heat sink 102. Screws 210 are configured so that there is no electrical contact between screws 210 and mounting screws 316.

Amplifier 100 is mounted to mounting surface 150 using one or more mounting screws 316, so that when amplifier 100 is mounted, there is no contact between heat sink 102 and mounting screws 316. To prevent electrical conductivity between surface 150 and heat sink 102, it is preferred that isocoupling 303 be used to electrically insulate heat sink 102 from mounting screws 316. Referring to FIG. 3, isocoupling 303 generally comprises two end sections 370, 380 joined to middle section 312 by one or more links 305. Alternatively, middle section 312 can be eliminated and replaced by a single link 305. In either embodiment or modifications thereof, isocoupling 303 is configured to have a first link aperture 317 and a second link aperture 318 extending through isocoupling 303 so that it can be fixedly positioned within isocoupling bore 109 and allow amplifier 100 to be fixedly positioned relative to mounting surface 150.

The use of a non-conductive material for isocoupling 303 allows the use of metal mounting screws 316 because the non-conductive material isolates mounting screws 316 and prevents them from contacting any metal or electrically conductive parts that may be present in amplifier 100. Preferably, a non-conductive material such as plastic or wood may be used. Isocoupling 303 acts as a non-conducting washer between heat sink 102 and mounting screw 316, allowing electrical isolation of heat sink 102 from surface 150. When isocoupling 303 is used simply to isolate heat sink 102 from surface 150 without being used to couple two amplifiers, mounting screws 316 are inserted through aperture 205, first link aperture 317, and aperture 206 so that first end section 370 is flush with isocoupling bore end 390. Mounting screw 316 is then screwed into mounting surface 150 to fixedly position amplifier 100 relative to surface 150.

Figure 4:
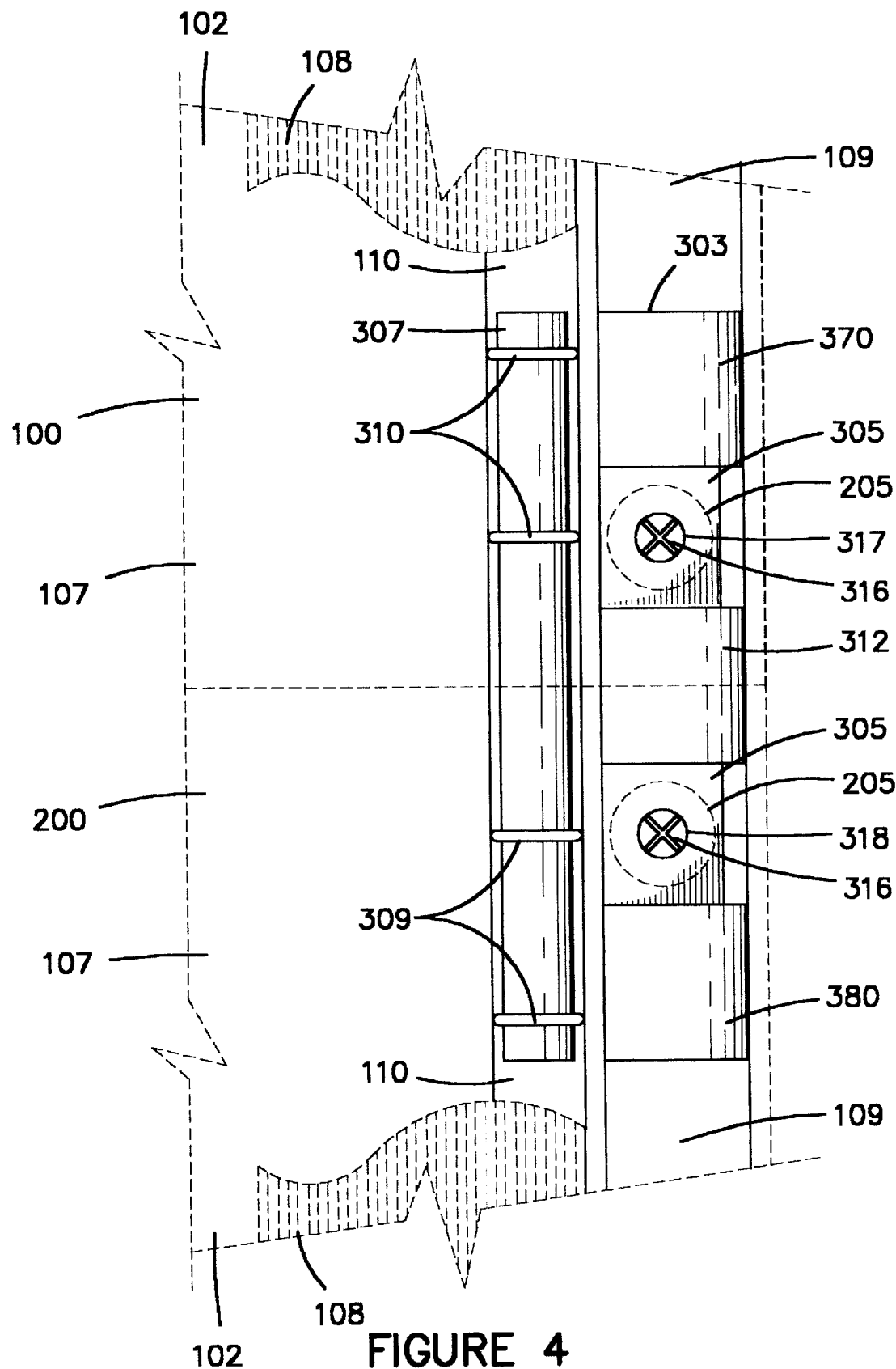
FIG. 4 is a top view showing two amplifiers connected by an isocoupling and having cooling channels connected by a channel coupling.

Isocoupling bores 109 are positioned at each end 220, 230 of heat sink 102 to allow coupling between two or more amplifiers 100, 200 as best seen in FIG. 4. When two or more amplifiers 100, 200 are coupled together, isocoupling 303 is used to couple them. Isocouplings 303 slidingly engage isocoupling bores 109 so that second link aperture 318 aligns with apertures 205, 206 in heat sink 102 to allow mounting screws 316 to pass through aperture 205, second link aperture 318 and aperture 206 and into mounting surface 150 to fixedly position isocoupling 303 relative to amplifier 100 and to fixedly position amplifier 100 relative to surface 150.

Second amplifier 200 is then positioned over isocoupling 303 so that isocoupling 303 engages isocoupling bore 109 in second amplifier 200. Apertures 205, 206 in second amplifier 200 are then aligned with first link aperture 317 in isocoupling 303. A second mounting screw 316 is then used to fixedly position amplifier 200 relative to amplifier 100 and relative to surface 150. Second mounting screw 316 is inserted through aperture 205 in second amplifier 200, into first link aperture 317, through aperture 206 in second amplifier 200 and into surface 150. Preferably, isocoupling bores 109 and isocoupling 303 are constructed so that if a middle section 312 is used, it extends at least partly into both first amplifier 100 and second amplifier 200.

Amplifier 100 is also configured with one or more cooling channels 110 positioned within upper wall 107. Cooling channels 110 are preferably positioned offset from the amplifier control pod 202 and circuit board 101 to prevent any leaking from channels from damaging amplifier control pod 202 or circuit board 101. Cooling channels 110 are also positioned as close as possible to output devices 103 to increase the efficiency of the cooling process.

Referring to FIGS. 3 and 4, when a single amplifier 100 having a pair of cooling channels 110 is used, a U-shaped cooling tube 350 is preferably attached at first end 220 to allow coolant to flow in a closed path through amplifier 100. U-shaped cooling tube 350 can be attached to a first cooling channel 320 and a second cooling channel 330 at first end 220. Other shaped cooling tubes can be used as long as the first and second cooling channels 320, 330 are operatively connected.

An inlet tube is then connected between a source of coolant and first cooling channel 320 at second end 230 by attaching the inlet tubing over channel coupling 307 or otherwise operatively connecting the inlet tubing to first cooling channel 320. Outlet tubing is then connected between the source of coolant and second cooling channel 330 by attaching the outlet tubing over the channel coupling 307 to be engaged with second cooling channel 330 or otherwise operatively connecting outlet tubing to second cooling channel 330. The coolant is then circulated to dissipate the heat generated by output devices 103. The position of the U-shaped tube 350 and the inlet and outlet tubes could be modified as long as coolant flows in a circuit. Alternatively, each cooling channel 110 can be separately connected to a source of coolant so that two separate coolant circulating paths are thereby created. In another embodiment, open, single pass cooling can be used where a coolant, such as water, is passed through the cooling channels 110 without being recirculated or recycled.

When two or more amplifiers 100 are used, the cooling channels 110 in each respective amplifier 100 may be fluidly connected using a cooling channel coupling 307 as seen in FIGS. 3 and 4. Cooling channel coupling 307 is a tubular member having a coolant bore 308 extending axially therethrough. Channel coupling 307 is shaped according to the cross-sectional shape of cooling channels 110, which are preferably circular, but other cross-sectional shapes may also be used. Channel coupling 307 and cooling channels 110 may be correspondingly threaded or may be configured so that channel coupling 307 snaps into cooling channel 110. Other connecting means well known in the art may also be used.

Channel coupling 307 comprises a two pairs of o-rings 309, 310, which slide into respective cooling channels 110 configured within amplifiers 100, 200, forming a seal to prevent coolant from leaking between cooling channel 110 and channel coupling 307. Accordingly, o-rings 309 are positioned within cooling channel 110 in amplifier 200 while o-rings 310 are positioned within cooling channel 110 in amplifier 100. Amplifiers 100, 200 are then connected to a source of cooling fluid using U-shaped tube 350, the inlet tube, and outlet tube. Coolant is then circulated through the cooling channels 110 in each amplifier 100, 200 while the amplifier is operated.

Heat sink 102 can be constructed from a suitable extrudable and thermally conductive material that promotes heat transfer from output devices 103. One preferred material is aluminum, but other materials may also work. Heat sink 102 can be manufactured from a standard extrusion process, but heat sink 102 could also be die cast, welded, molded or formed using commonly known methods for forming thermally conductive materials. Amplifier 100 can be connected to a variety of coolant sources such as the coolant system of an automobile or a coolant system specially designed for operation with amplifier 100.

Although the preferred embodiment has been described, it will be appreciated by those skilled in the art to which the present invention pertains that modifications, changes, and improvements may be made without departing from the spirit of the invention defined by the claims.

I claim:

1. An amplifier having a heat sink, a circuit board affixed to the heat sink, audio output adjustment devices affixed to the circuit board, and controls for adjustment of the audio output from the devices, the improvement to which comprises:

a control pod housing said controls, said control pod being physically attachable to said circuit board to permit said controls to adjust said devices and being remotely positionable relative to said amplifier while maintaining communication with said circuit board to permit said controls to adjust said devices.

2. The amplifier according to claim 1 further comprising a mounting member used to mount said amplifier to a surface, and an isocoupling, said isocoupling constructed to electrically isolate said mounting member from said amplifier.

3. The amplifier according to claim 2 wherein said isocoupling is sized and shaped and constructed from material to electrically isolate a second mounting member used to mount a second amplifier to a second surface and to couple said amplifier said second amplifier.

4. The amplifier according to claim 1 wherein said amplifier further comprises a heat sink having one or more walls forming at least one isocoupling bore extending from a surface of said heat sink and into said heat sink.

5. The amplifier according to claim 4 further comprising an isocoupling, said isocoupling sized and shaped to fit within said isocoupling bore, said isocoupling comprising:
 a first end section sized and shaped to be positionable within said isocoupling bore, said first end section having a first aperture extending through opposite sides of said first end section; and
 a second end section sized and shaped to be extendable from said isocoupling bore and extendable into an isocoupling bore of a second amplifier to permit coupling of said amplifier to said second amplifier; said second end section having a second aperture extending through opposite sides of said second section.

6. The amplifier according to claim 5 wherein said walls forming said isocoupling bore have two aligned mounting member apertures defining a passageway through said walls and said isocoupling bore that is alignable with the first end section aperture when extended into said isocoupling bore.

7. The amplifier according to claim 6 further comprising:
 a least one heat generating device;
 a heat sink in thermal communication with said heat generating device, said heat sink configured to have at least one cooling channel extending therethrough, said cooling channel attachable to a source of coolant.

8. The amplifier according to claim 7 wherein said cooling channel is offset from said circuit board.

9. The amplifier according to claim 7 wherein said cooling channel is offset from said control pod receptacle.

10. An amplifier comprising:
 a circuit board having one or more controls operatively connected thereto,
 a heat sink in thermal communication with said circuit board, said heat sink having at least one wall forming at least one isocoupling bore extending from a surface of said heat sink and into said heat sink,
 a mounting member constructed to mount said amplifier to a surface, and
 an isocoupling sized and shaped to fit within said bore and positionable to electrically isolate said mounting member from said amplifier.

11. The amplifier according to claim 10 wherein said isocoupling is sized and shaped and constructed from material to electically isolate a second mounting member used to mount a second amplifier to a second surface and to couple said amplifier to said second amplifier.

12. The amplifier according to claim 10 wherein said isocoupling comprising:
 a first end section sized and shaped to be positionable within said isocoupling bore, said first end section having a first aperture extending through opposite sides of said first end section; and
 a second end section sized and shaped to be extendable from said isocoupling bore and extendable into an isocoupling bore of a second amplifier to permit coupling of said amplifier to said second amplifier; said second end section having a second aperature extending through opposite sides of said second section.

13. The amplifier according to claim 12 wherein said walls forming said isocoupling bore have two aligned mounting member aperatures defining a passageway through said walls and said isocoupling bore that is alignable with the first end section aperature extended into said isocoupling bore.

14. The amplifier according to claim 13 further comprising audio output adjustment devices affixed to said circuit board, controls for adjustment of the audio output from said devices, and a control pod housing said controls, said control pod being physically attachable and detachable to said circuit board to permit said controls to adjust said devices when attached or detached.

15. The amplifier according to claim 14 further comprising at least one heat generating device in thermal communication with said circuit board and said heat sink, said heat sink configured to have at least one cooling channel extending therethrough, said cooling channel attachable to a source of coolant.

16. The amplifier according to claim 15 wherein said cooling channel is offset from said circuit board.

17. The amplifier according to claim 15 wherein said cooling channel is offset from said control pod receptacle.

18. In an amplifier having a heat sink, a circuit board affixed to the heat sink, audio output adjustment devices affixed to the circuit board, and controls for adjustment of the audio output from the devices, the improvement to which comprises:
 said heat sink configured to have parallel cooling channels, each extending from one end of said heat sink to an opposite end of said heat sink,
 a first hollow coupling tube having sealing members affixed to opposite end sections of said first tube, each of said opposite end sections sized to extend into at least one end of one of said parallel cooling channels to permit coolant flowing through one of said parallel cooling channels to flow to other of said parallel cooling channels,
 a second hollow coupling tube having sealing members affixed to at least one end section of said second tube, said one end section of said second tube sized to extend into that end of said one of said parallel cooling channels into which coolant is to flow, said second tube attachable to a source of coolant, and
 a third hollow coupling tube having sealing members affixed to at least one end section of said third tube, said one end section of said third tube sized to extend into that end of said one of said parallel cooling channels from which coolant is to flow.

19. The amplifier according to claim 18 wherein said heat sink is configured to have one or more walls forming at least one isocoupling bore extending from a surface of said heat sink and into said heat sink.

20. The amplifier according to claim 19 further comprising a control pod removably attached to said circuit board, said control pod remotely positionable relative to said amplifier, said control pod maintaining communication with said circuit board when remotely positioned from said amplifier, said control pod housing at least one of said one or more controls.

21. The amplifier according to claim 20 further comprising an isocoupling, said isocoupling configured to electrically isolate said amplifier from a surface onto which said amplifier is mounted.

22. The amplifier according to claim 21 wherein said isocoupling is sized and shaped and constructed from material to electrically isolate a second mounting member used to mount a second amplifier to a second surface and to couple said amplifier to said second amplifier.

23. The amplifier according to claim 20 further comprising an isocoupling, said isocoupling sized and shaped to fit within said isocoupling bore, said isocoupling comprising:
   a first end sized and shaped to be positionable within said isocoupling bore, said first end section having a first aperture extending through opposite sides of said first end section; and
   a second end section sized and shaped to be extendable from said isocoupling bore and extendable into an isocoupling bore of a second amplifier to permit coupling of said amplifier to said second amplifier; said second end section having a second aperature extending through opposite sides of said second section.

24. The amplifier according to claim 23 wherein said walls forming said isocoupling bore have two aligned mounting member aperatures defining a passageway through said walls and said isocoupling bore that is alignable with the first end section aperature when extended into said isocoupling bore.

25. The amplifier according to claim 16 wherein said cooling channel is offset from said circuit board.

26. The amplifier according to claim 18 wherein said cooling channel is offset from said control pod receptacle.

27. A method for coupling a first and second amplifier, each having a heat sink having one or more walls forming at least one isocoupling bore extending from a surface of said heat sink and into said heat sink, said walls having two aligned mounting member aperatures defining a passageway through said walls and said isocoupling bore, said method comprising the steps of:
   (a) inserting an isocoupling sized and shaped to fit within said isocoupling bore of said first amplifier, said isocoupling comprising:
      (i) a first end section sized and shaped to be positionable within said isocoupling bore of said first amplifier, said first end section having a first aperture extending through opposite sides of said first end section and positioned to be alignable with said two mounting member aperatures of said isocoupling bore of said first amplifier, and
      (ii) a second end section sized and shaped to extendable from said isocoupling bore of said first amplifier and into said isocoupling bore of said second amplifier, said second end section having a second aperature extending through opposite sides of said second section and positioned to be alignable with said two mounting member aperatures of said isocoupling bore of said second amplifier;
   until said first aperture aligns with said two mounting member aperatures of said first amplifier;
   (b) inserting a mounting member through said first aperture and said two mounting member aperatures of said first amplifier and manipulating said mounting member to fixedly position said first amplifier in a desired position;
   (c) inserting said second end section of said isocoupling into said isocoupling bore of said second amplifier until said second aperture aligns with said two mounting member apertures in said second amplifier;
   (d) inserting a second mounting member through said second aperture aperature and said two mounting member apertures of said second amplifier and manipulating said second mounting member to fixedly position said second amplifier in its desired position.

28. The method according to claim 27 wherein said first and second amplifiers further comprise a circuit board having a least one heat generating device attached thereto; a heat sink in thermal communication with said heat generating device, said heat sink configured to have at least one cooling channel extending therethrough, said cooling channel attachable to a source of coolant, said method further comprising the steps of:
   (a) connecting said cooling channel to a source of coolant;
   (b) operating said amplifier(s);
   (c) circulating a coolant through said cooling channels.

29. The method according to claim 27 wherein said one or more amplifiers form a first cooling channel and a second cooling channel, said method further comprising the steps of:
   (a) operatively connecting said first cooling channel to said second cooling channel;
   (b) operatively connecting said first cooling channel and said second cooling channel to said source of coolant.

* * * * *